(12) United States Patent
Burkhardt et al.

(10) Patent No.: US 8,507,346 B2
(45) Date of Patent: Aug. 13, 2013

(54) METHOD OF FORMING A SEMICONDUCTOR DEVICE HAVING A CUT-WAY HOLE TO EXPOSE A PORTION OF A HARDMASK LAYER

(75) Inventors: Martin Burkhardt, White Plains, NY (US); Matthew E. Colburn, Schenectady, NY (US); Allen H. Gabor, Katonah, NY (US); Oleg Gluschenkov, Tannersville, NY (US); Scott D. Halle, Slingerlands, NY (US); Howard S. Landis, Underhill, VT (US); Helen Wang, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 12/949,148

(22) Filed: Nov. 18, 2010

(65) Prior Publication Data
US 2012/0126294 A1    May 24, 2012

(51) Int. Cl.
*H01L 21/336* (2006.01)
*H01L 21/8234* (2006.01)
*H01L 21/84* (2006.01)
*H01L 21/338* (2006.01)
*H01L 21/3205* (2006.01)
*H01L 21/4763* (2006.01)
*H01L 21/311* (2006.01)
*H01L 21/302* (2006.01)
*H01L 21/461* (2006.01)

(52) U.S. Cl.
USPC ........... 438/283; 438/151; 438/176; 438/197; 438/585; 438/636; 438/694; 438/700; 438/703; 438/734

(58) Field of Classification Search
None
See application file for complete search history.

(56) References Cited

U.S. PATENT DOCUMENTS

| | | | |
|---|---|---|---|
| 6,911,386 B1 * | 6/2005 | Lee et al. | 438/612 |
| 2007/0287200 A1 | 12/2007 | Anderson et al. | |
| 2008/0017992 A1 * | 1/2008 | Kito et al. | 257/773 |

* cited by examiner

*Primary Examiner* — Michael Jung
(74) *Attorney, Agent, or Firm* — Cantor Colburn LLP; Parashos Kalaitzis

(57) ABSTRACT

A method of forming a semiconductor device having a substrate, an active region and an inactive region includes: forming a hardmask layer over the substrate; transferring a first pattern into the hardmask layer in the active region of the semiconductor device; forming one or more fills in the inactive region; forming a cut-away hole within, covering, or partially covering, the one or more fills to expose a portion of the hardmask layer, the exposed portion being within the one or more fills; and exposing the hardmask layer to an etchant to divide the first pattern into a second pattern including at least two separate elements.

4 Claims, 5 Drawing Sheets

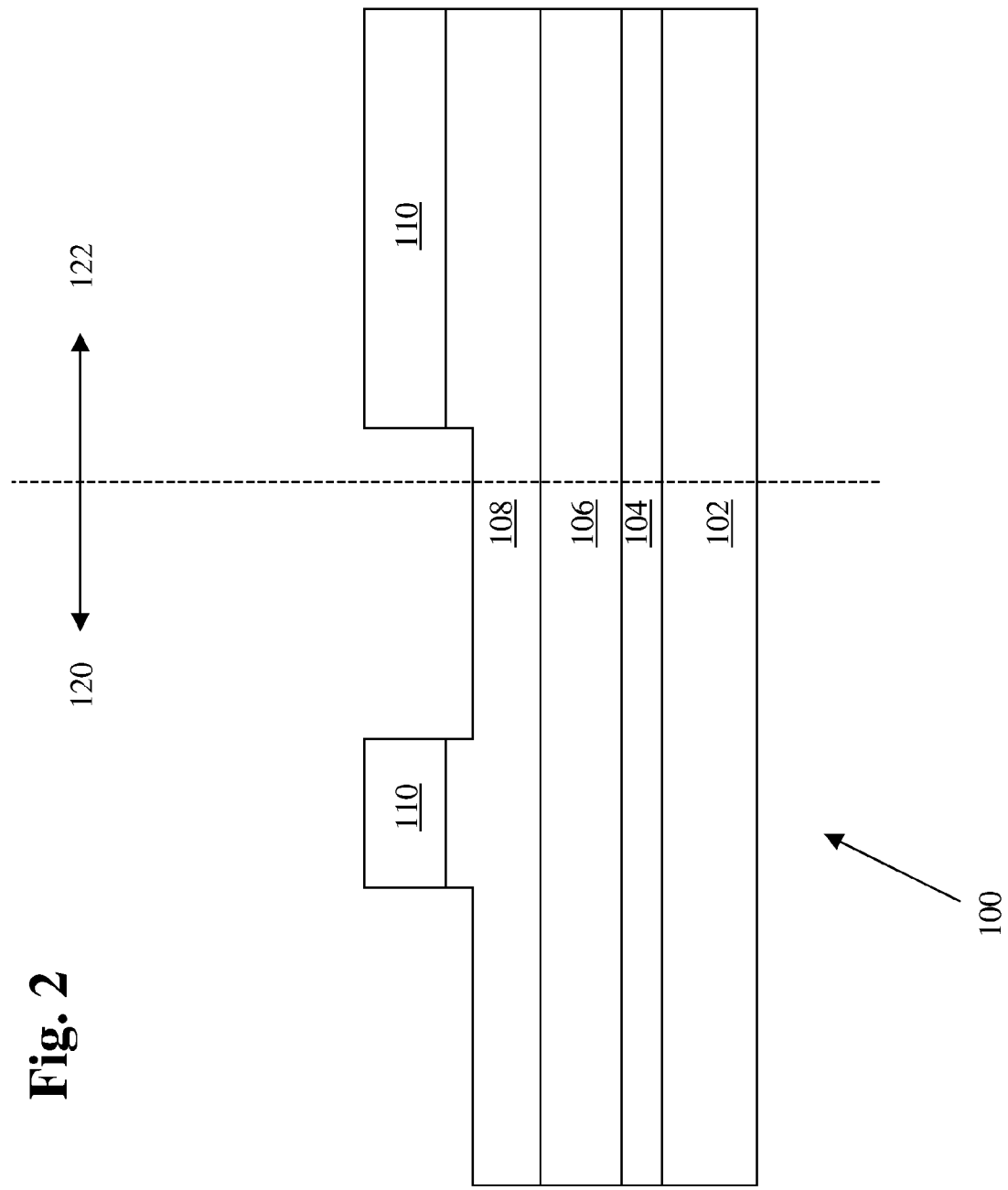

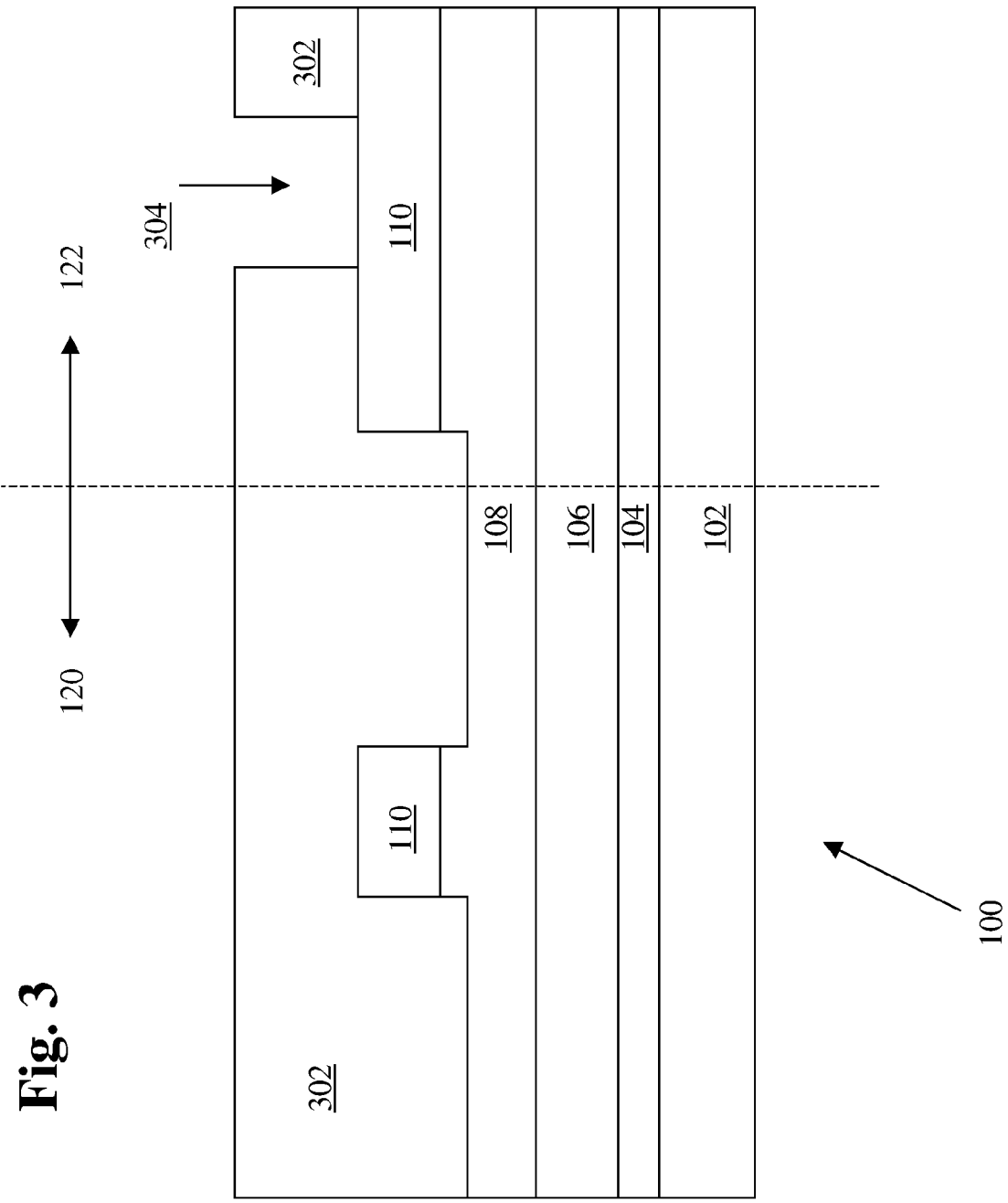

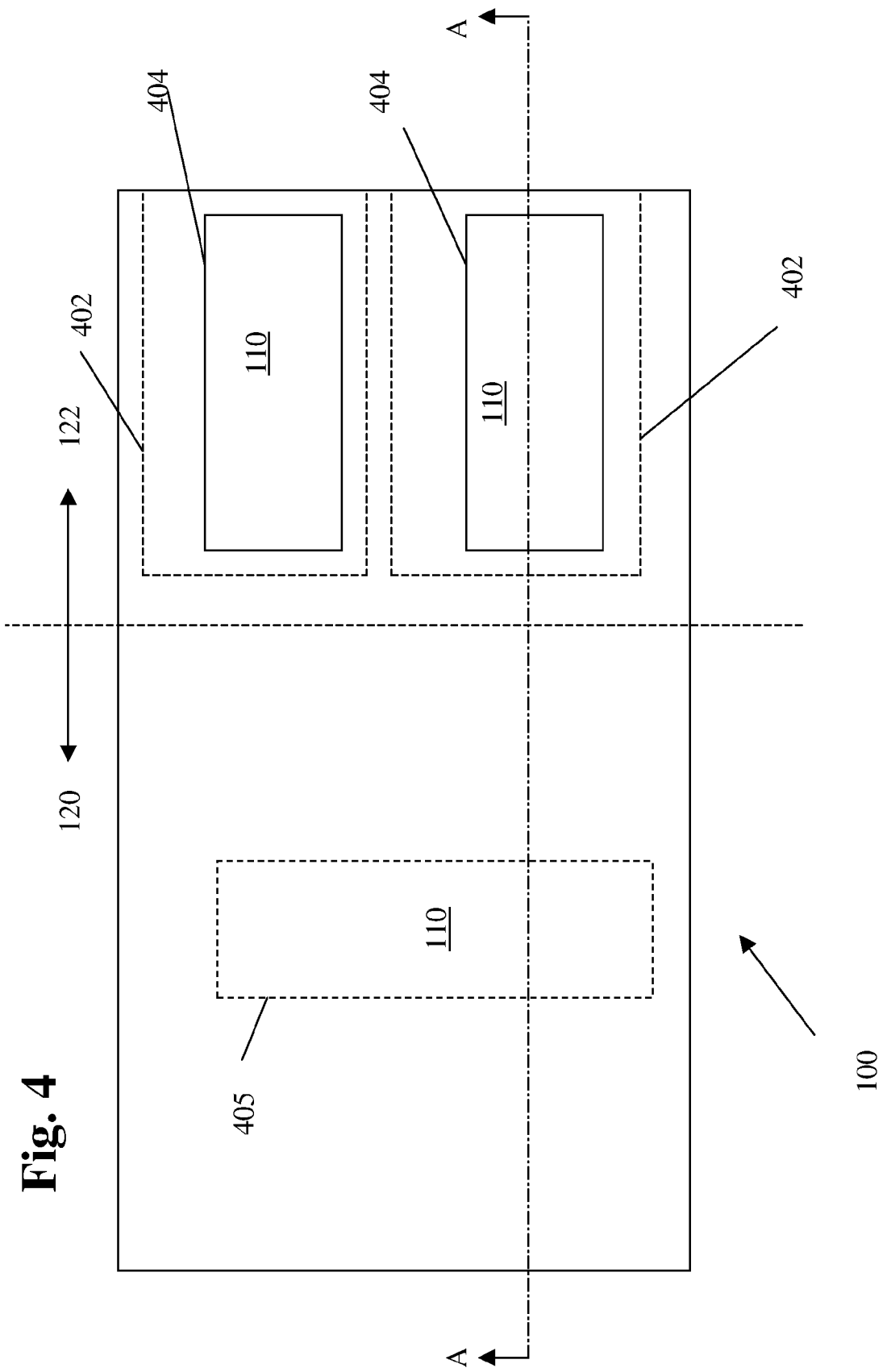

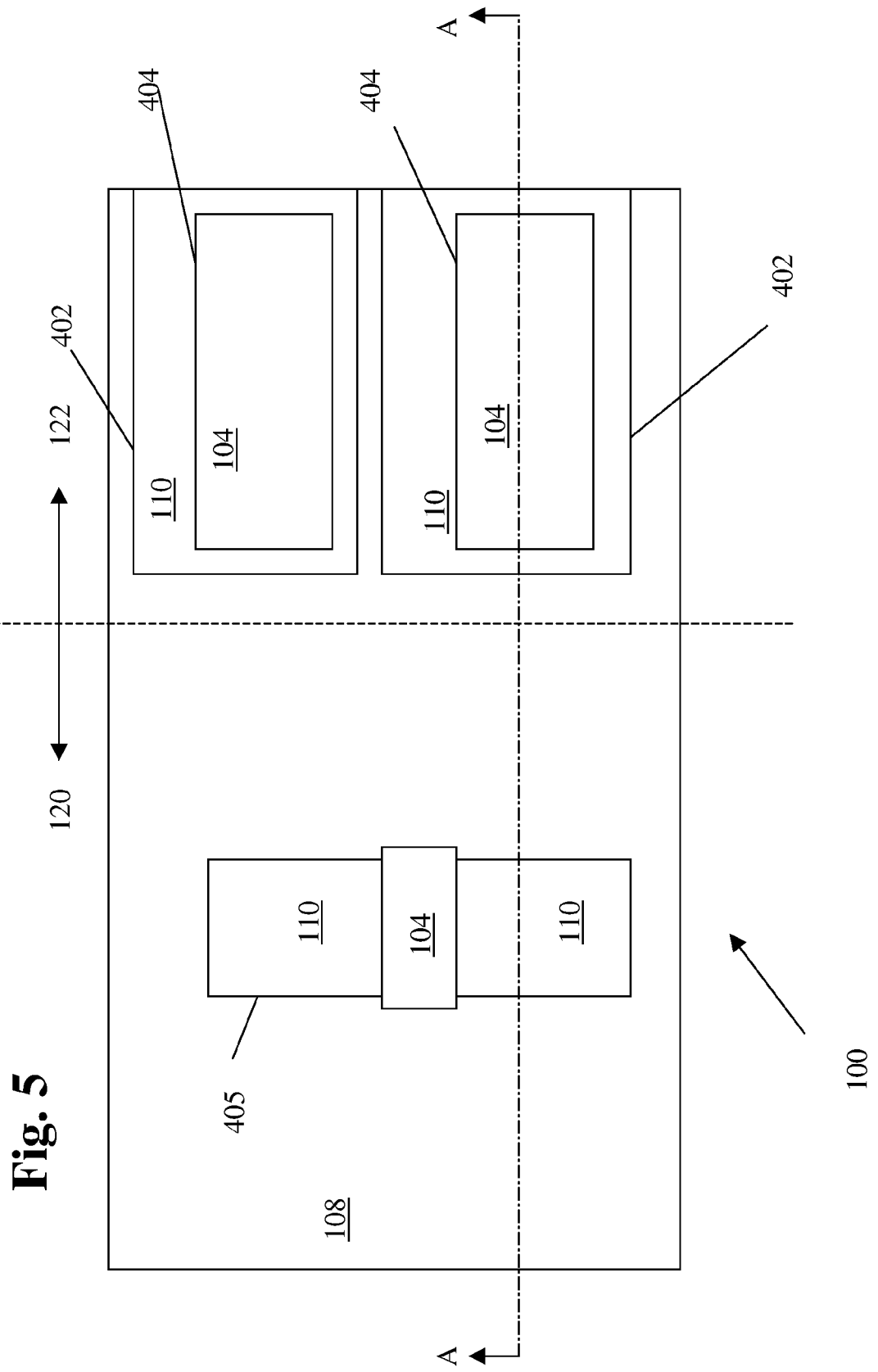

METHOD OF FORMING A SEMICONDUCTOR DEVICE HAVING A CUT-WAY HOLE TO EXPOSE A PORTION OF A HARDMASK LAYER

BACKGROUND

The present invention relates to semiconductor device processing, and more specifically, to utilizing fill shapes and patterns during the processing.

Multiple-step patterning processes that require pattern/etch transfer between multiple lithography steps (e.g., double etch double exposure (DE2)) typically transfer the pattern into an intermediate hardmask material. Control of the intermediate pattern transfer is critical to multiple patterning. There are, however, process sensitivities that make the intermediate etch patterning difficult to control with a timed etch. Overcoming these difficulties may require the utilization of an optical endpoint to ensure that the etching process does not remove too much material.

For example, in the instance where a gate is to be formed and then cut the following multiple step process may begin with a resist layer being patterned to overlay the gate material. In many instances, the gate material overlays a gate oxide layer. The exposed gate material is then removed with a first process to leave a gate strip in the area under the resist pattern. Then, two or more portions of the gate are again covered with a layer of resist. The exposed portions are then exposed to a timed etch. The underlying gate oxide layer may serve as the optical endpoint for the time etch. However, in the event that the gate is narrow or the width of the exposed portions is minimal, there may not be enough gate oxide to serve as an effective optical endpoint.

SUMMARY

According to one embodiment of the present invention, a method of forming a semiconductor device having a substrate, the semiconductor device having an active region and an inactive region is disclosed. The method of this embodiment includes: forming a hardmask layer over the substrate; transferring a first pattern into the hardmask layer in the active region of the semiconductor device; forming one or more fills in the inactive region; forming a cut-away hole within, covering, or partially covering, the one or more fills to expose a portion of the hardmask layer, the exposed portion being within the one or more fills; and exposing the hardmask layer to an etchant to divide the first pattern into a second pattern including at least two separate elements.

According to another embodiment of the present invention, a semiconductor device is disclosed. The device of this embodiment includes an active region including an element formed in a double etch, double exposure method and an inactive region including one or more fills. In this embodiment, at least one of the one or more fills includes a cut-away hole formed therein, where the cut-away holes expose a layer in the inactive region used for an endpoint detection.

According to yet another embodiment of the present invention, a semiconductor device this includes an active region containing active circuit elements and an inactive region, the inactive region including a plurality of fill objects is disclosed. In this embodiment, a first portion of the fills include cut-away holes utilized for endpoint detection and a second portion for the fills include cut-away holes utilized for varying reflectivity of portions of the device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 shows the device of FIG. 1 after an etching process has removed unprotected portions of hardmask A down to hardmask B;

FIG. 3 shows the device of FIG. 2 covered with a layer of resist;

FIG. 4 is an overhead view of the device shown in FIG. 3; and

FIG. 5 shows the device of FIG. 3 after the upper film has been cut.

DETAILED DESCRIPTION

Figure 1:
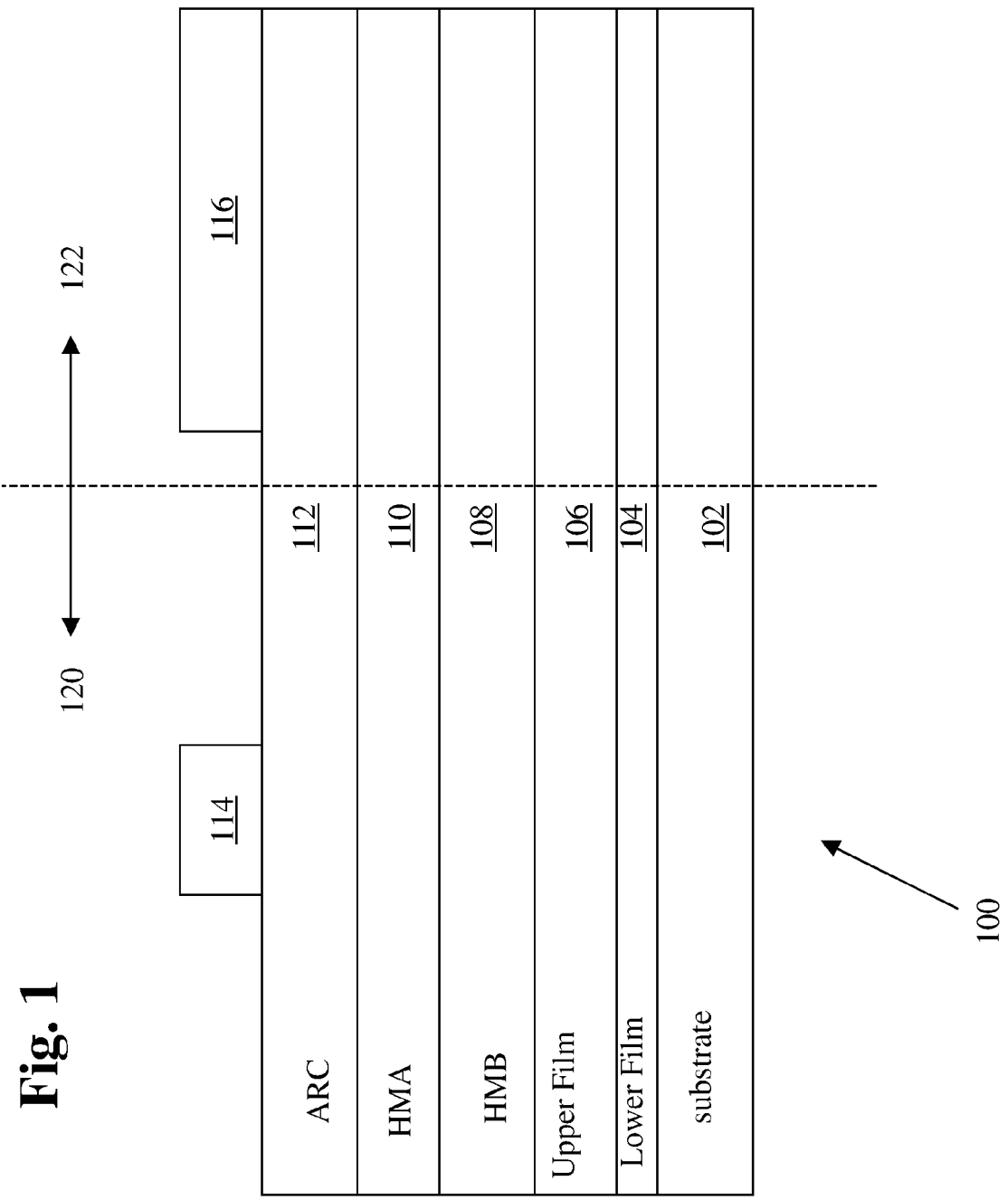
FIG. 1 shows a cut-away side view of a portion of a semiconductor device 100 at an example stage in the processing thereof.

Embodiments of the present invention may utilize fill material and holes formed therethrough for double patterning when a pattern is split into two or more masks. Such embodiments may enable enhanced process control with optical endpoint signals needed for multiple patterning process using split different tone reticles.

As used herein, a "fill" or "fill shape" is an inactive element placed on a wafer. Fill shapes are used in semiconductor processes to reduce variation in various process layers. Fill shapes can be created and placed based on many criteria to reduce variation in the semiconductor process. For example, fill shapes can be distributed in a fixed pattern to achieve a target pattern density using regular fill patterns.

It shall be understood that the term "cut-away" when used as noun refers to a region of an element that has been removed. The term "cut-away" when used a verb refers to the act or process of removing the regions. In one embodiment, one or more fills are cut-away to from cut-aways therein in order to aid in endpoint detection.

It has also been discovered, that only a portion of the fills need to be cut-away for effective optical endpoint detection. In one embodiment, some or all of the fills not utilized for endpoint detection may be used to adjust a parameter (such as reflectively) of various portions of the wafer.

FIG. 1 shows a cut-away side view of a portion of a semiconductor device 100 at an example stage in the processing thereof. The device 100 may include a substrate 102 covered by a one or more film layers. As shown in FIG. 1, the substrate is covered by an upper film 106 and a lower film 104 where the upper film 106 is above the lower film 104. In one embodiment, the upper film 106 may be a gate material and the lower film may be a gate oxide material. Of course, the number of film layers may vary. In addition, the term "film layer" is used merely as a descriptor and could, for example, refer to any layer that needs to be patterned accordingly to the present invention regardless of how created, formed or the material that composes the layer. In one embodiment, the lower film 104 may directly contact the substrate 102. In one embodiment, the upper film 106 may directly contact the lower film 104.

The semiconductor device 100 of FIG. 1 may also include one or more hardmask layers. In this example, the device 100 includes two hardmask layers because the device 100 may be exposed to a DE2 process. In particular, the device 100 of FIG. 1 includes a hardmask B 108 and hardmask A 110 over hardmask B 108. In one embodiment, hardmask B 108 directly contact the upper film 106. In one embodiment, hardmask A 110 may directly contact the hardmask B 108.

The semiconductor device 100 may also include an anti-reflective coating (ARC) layer 112 disposed over hardmask A. The ARC layer 112 serves to reduce unwanted reflections from the films that underlie it.

The semiconductor device 100 may include an active region 120 and an inactive region 122. As shown in FIG. 1, the active region 120 may include a first pattern of resist 114 to form an element (e.g., a gate strip) in the active region 120. In addition, the inactive region 122 may include a second resist pattern 116 to form a fill in the inactive region 122. The following description will describe how an active element and a cut-away fill in the inactive region 122 may be formed. The cut-away fill may be utilized to enhance optical endpoint detection utilized in the active element formation.

FIG. 2 shows the device 100 after an etching process has removed unprotected portions of hardmask A 110 down to hardmask B 108. Optical endpoint detection may have been utilized in a timed etch based on hardmask B 108 to achieve the result shown in FIG. 2. In one embodiment, FIG. 2 represents result of the first part of a double etch double exposure process.

FIG. 3 shows the device 100 of FIG. 2 covered with a layer of resist 302. A cut-away portion 304 is formed in the resist layer 302 over the remaining hardmask A 110 in the inactive region 122. Stated differently, a hole (cut-away portion 304) is opened in the resist layer in regions overlaying one or more fills being formed in the inactive region 112.

FIG. 4 is an overhead view of the device 100 shown in FIG. 3. At this stage in the fabrication of the device 100, one or more fills 402 (show in dashes indicating they are covered by resist) include holes 404 formed in them exposing a lower layer. In one embodiment, as shown in FIG. 4, the lower layer is hardmask A 110. Of course, another layer could be exposed depending on the situation. The active element 405 being formed in the active area 120 is covered by hardmask A 110 (shown in dashes as being under the resist layer).

It shall be understood that FIGS. 1-3 have been section views through section line A-A shown in FIG. 4.

FIG. 5 shows the device 100 after the upper film 106 has been cut. This process included opening a hole in the resist of FIG. 4 to expose the desired area of hardmask A 110 to be removed. Then, an etch was performed that removes material (e.g., layers 108 and 106) down to the lower film 104. This etch may utilize optical endpointing based on the lower film 104. It shall be understood that the amount of lower film 104 exposed during this process is increased because the fills 402 have cut-away holes 404 formed therein. This increase in exposed lower film 104 may be required for accurate optical endpointing because the amount exposed in the active area 120 is minimal.

It has been discovered that above technique is useful for end point detection as described above. It has also been discovered that not every fill utilized in the inactive area is required for effective end point detection nor is the density or location of the cut-away fills a vital factor in endpoint detection. In addition, it has been discovered that that the presence of cut-away holes (also referred to herein as CT fill) widens the range of overall attainable local broad-band reflectivity in the fill area. Hence, CT fill with average die density of between 10% to 90% can be intelligently segregated in parts of such die to attain improved leveling of the local broad-band rapid thermal anneal reflectivity without compromising end point detection.

Based on these observations, in one embodiment of the present invention, reflectivity differences in the various levels forming fill are used to level out cross-die reflectivity variation. That is, some fills may be cut-away to vary expose different levels having different reflectivities in various locations of the die to level out cross die reflectivity. In one embodiment, this may improve reflectivity leveling by employing a wider range of reflectivity that attainable through fill shape manipulation alone. Indeed, adding CT fills (cut-aways) may create more scattering boundaries and result in a decrease in local fill reflectivity. In addition, keeping fill density constant in the presence of CT fills may allow for using a larger fill shape. A larger shape leads to an increase in local reflectivity.

Accordingly, one embodiment of the present invention may be directed to a chip having two inactive regions. In one of the inactive regions, fills with holes are present and in another the fills do not includes cut-away holes. It has been discovered that it may be advantageous to have the two inactive regions separated by more than 0.5 mm. In one embodiment, the cut-away hole containing fills are located on top of another fill. In such an embodiment, the bottom fill may be an RX fill while the top fill is a PC fill. In the other region, the fills not containing a hole are location on, or at least 50% on, a shallow trench isolation (STI) region.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a semiconductor device having a substrate, the semiconductor device having an active region and an inactive region, the method comprising:
    forming a first film layer over the substrate;
    forming a second film layer over the first film layer;
    forming a hardmask layer over the second film layer;
    transferring a first pattern onto the hardmask layer in the active region of the semiconductor device;
    forming one or more fills in the inactive region;
    forming a cut-away hole within, covering, or partially covering, the one or more fills to expose a portion of the hardmask layer, the exposed portion being within the one or more fills; and
    exposing the hardmask layer to an etchant;
    wherein the first film layer is a gate oxide layer and wherein the second film layer is a gate material.

2. The method of claim 1, further comprising:
    stopping the exposure of the hardmask layer to the etchant based on an optical endpoint determination.

3. The method of claim 1, wherein exposing causes portions of the hardmask layer and another hardmask layer to be removed.

4. The method of claim 1, further comprising:
    opening a portion of a resist material over the hardmask layer before exposing.

* * * * *